United States Patent
Klass et al.

(10) Patent No.: US 7,461,305 B1
(45) Date of Patent: Dec. 2, 2008

(54) SYSTEM AND METHOD FOR DETECTING AND PREVENTING RACE CONDITION IN CIRCUITS

(75) Inventors: Edgardo F. Klass, Palo Alto, CA (US); Peter Smeys, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 561 days.

(21) Appl. No.: 11/115,632

(22) Filed: Apr. 26, 2005

(51) Int. Cl.
*G06K 5/04* (2006.01)
(52) U.S. Cl. ...................................... 714/700
(58) Field of Classification Search .................. 714/700
See application file for complete search history.

(56) References Cited

U.S. PATENT DOCUMENTS

| | | | | |
|---|---|---|---|---|
| 5,608,645 | A * | 3/1997 | Spyrou | 716/6 |
| 6,915,462 | B1 * | 7/2005 | Davis et al. | 714/700 |
| 7,236,555 | B2 * | 6/2007 | Brewer | 375/357 |
| 2002/0009169 | A1 * | 1/2002 | Watanabe | 375/371 |

* cited by examiner

*Primary Examiner*—James C Kerveros
(74) *Attorney, Agent, or Firm*—Martine Penilla & Gencarella, LLP

(57) ABSTRACT

A system and method for detecting and preventing race conditions in a circuit is provided. The system includes a first memory element for receiving a data stream. The system further includes a plurality of additional memory elements for directly receiving an output of the data stream from the first memory element. Delay elements are defined between the first memory element and the plurality of additional memory elements other than a second memory element, so that each delay element between the first memory element and the plurality of additional memory elements other than the second memory element are combined to define a sum delay. A plurality of comparators are connected to the plurality of memory elements such that each comparator being configured to compare an input to the first memory element and an output of each of the plurality of additional memory elements. The output from the comparator helps to identify whether a race condition is present between the first memory element and any one of the plurality of additional memory elements.

15 Claims, 3 Drawing Sheets

SYSTEM AND METHOD FOR DETECTING AND PREVENTING RACE CONDITION IN CIRCUITS

BACKGROUND

Description of the Related Art

Most of the electronic circuits today are made of digital circuits. Race conditions often affect digital circuits. Circuits with flip-flops and latches are particularly prone to race conditions. Race conditions occur when one of the elements in the digital circuit is delayed more than the other elements in the digital circuit due to process variations that took place during manufacturing of the element and other external factors such as resistance, capacitance, voltage, and temperature among others. Race conditions can lead to unpredictable operations. Even though race conditions are inherently timing problems, they cannot be avoided by slowing the clock frequency of the system.

One of the solutions is to include precautionary measures in the design itself. However, this solution is not infallible. Another proposed solution involves margining the timing of the racing path. Margining ensures that fast path is always faster or the slow path is slower under all process conditions. However, slowing things generally is easier than speeding them up. Therefore, most of the existing solutions involve adding padding to slow the critical fast paths. The padding generally includes buffers. Addition of these extra elements can waste space. Additionally, these extra elements can also consume additional power. Since race conditions do not affect speed or performance, the solutions currently being used to fix race conditions is a design overhead.

In view of the foregoing, there is a need for a method to fix race conditions in digital circuits with minimum overhead.

SUMMARY

Broadly speaking, the present invention fills these needs by providing a method and system that can detect race conditions and compute precisely the minimum number of delays required to prevent race conditions. The system includes a signal generator that is capable of generating alternating 0s and 1s. The generated 0s and 1s are input to a first memory element and subsequent memory elements receive the generated 0s and is directly from the first memory element. Delay elements are added between the first and subsequent memory elements except for the second memory element. The number of delays progressively increases as the number of memory elements increases. For example, there is one delay element between the first memory element and the third memory element. There are two delay elements between the first memory element and the fourth memory element, three delay elements between the first memory element and fifth memory element, and so on. The embodiments of the present invention are configured to detect race conditions by reading the output from the memory elements and comparing them with the input to the first memory element. The result of this comparison dictates the number of delays required to prevent race conditions. This also ensures that there are no excess delays in the design to increase the overhead.

One aspect of the invention involves a circuit for determining the degree of buffering required along a data bus to avoid race conditions. The circuit includes a first memory element for receiving a data stream. The data stream may be generated by a signal generator. The circuit further includes a plurality of additional memory elements for directly receiving an output of the data stream from the first memory element. Delay elements are defined between the first memory element and the plurality of additional memory elements other than a second memory element, so that each delay element between the first memory element and the plurality of additional memory elements other than the second memory element are combined to define a sum delay. A plurality of comparators are connected to the plurality of memory elements such that each comparator is configured to compare an input to the first memory element and an output of each of the plurality of additional memory elements. The output of the comparator signifies whether a race condition is present between the first memory element and any one of the plurality of additional memory elements.

Another aspect of the invention includes a method for detecting race conditions. The method is initiated with a first memory element receiving a data stream. Then, a plurality of additional memory elements directly receive an output of the data stream from the first memory element. The data stream propagation between the first memory element and the plurality of additional memory elements other than a second memory element is delayed using delay elements. The sum delay is defined as the sum of the delays between the first memory element and the plurality of additional memory elements other than the second memory element. The method further includes comparing an input to the first memory element and an output of each of the plurality of additional memory elements to identify whether a race condition occurred.

Yet another aspect of the invention includes a circuit for determining a degree of buffering required along a data bus to avoid race conditions. The circuit includes means for receiving a data stream by a first memory element. The circuit further includes means for directly receiving outputs of the first memory element by additional memory elements. The circuit also includes means for delaying the outputs of the first memory element from reaching additional memory elements other than a second memory element. In addition, the circuit includes means for comparing an input to the first memory element and an output of each of the plurality of additional memory elements. The circuit further includes means for identifying whether a race condition is present between the first memory element and any one of the plurality of additional memory elements.

It should be appreciated that the present invention can be implemented in numerous ways, including as a process, an apparatus, a system, a device, or a method. Several inventive embodiments of the present invention are described below.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention for detecting race conditions in a digital circuit is disclosed. The embodiments described herein help to minimize the overhead associated with the use of excessive delay elements to prevent race conditions in digital circuits. In particular, the method and the system described herein can detect race conditions and compute precisely the minimum number of delays required to prevent race conditions. The designers can use this information, during the design process of the digital circuits, and incorporate the minimum number of delays into their design. Thus, overhead associated with excess delays can be eliminated.

Figure 1:
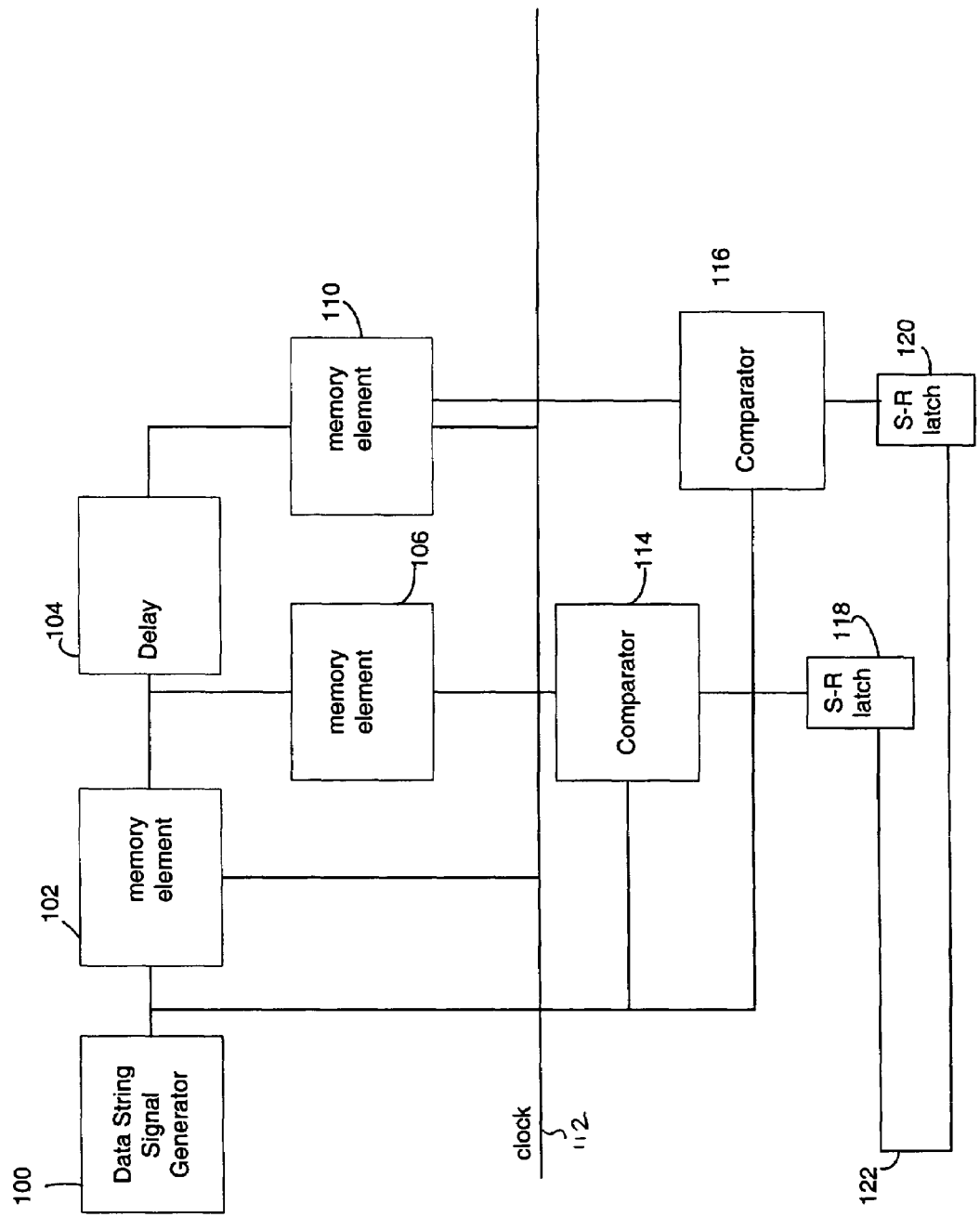
FIG. 1 shows a circuit that is capable of detecting race conditions in a digital circuit and indicating the minimum number of delays needed to prevent race conditions in a digital circuit in accordance with an embodiment of the present invention.

FIG. 1 shows a circuit to detect race conditions in a digital circuit and to indicate the minimum number of delays needed to prevent race conditions in a digital circuit in accordance with an embodiment of the present invention. FIG. 1 includes a data string generator 100. The data string signal generator 100 is capable of generating alternating data strings of 0s and 1s. In one embodiment, the data string signal generator 100 includes a frequency divider (not shown). FIG. 1 further shows a clock signal 112. The circuit also includes memory elements 102, 106 and 110. In one embodiment, the memory elements 102, 106 and 110 are edge-triggered flip-flops. Edge-triggered implies that the memory elements are responsive to transition in the clock cycle. For example, at the first rising edge of the clock cycle, the data generated by the data string generator 100 latches to memory element 102. At the second rising edge of the clock cycle, the data in the memory element 102 is passed to memory element 106 and delay 104. The inclusion of delay 104 ensures that there is sufficient hold time for the data existing in memory element 110 prior to the data from memory element 102 arrives at the memory element 110. Hold time as described herein, is the duration for which the input to a memory element must not change subsequent to the clock edge that triggers the memory element. One skilled in the art should understand that a mesh of alternating memory elements and delay may be created this way to prevent race conditions. Even though the state changes of the memory elements are explained in terms of the rising edge of the clock cycles, it should be understood that the state changes may occur during other phases of the clock cycle, such as the falling edge of the clock cycle.

FIG. 1 further shows the comparators 114 and 116. The comparators 114 and 116 receive data from the data signal generator 100 and the memory elements 106 and 110 respectively. One skilled in the art should understand that even though FIG. 1 shows three memory elements 102, 106, and 110, and delay 104, there can be any number memory elements and delays depending on the logic the circuit represents. The output of the comparators 114 and 116 determine whether a race condition has occurred. In one embodiment of the invention, where there are even number of delays between the memory element 102 and the subsequent memory elements, a 0 for the output of the comparator, indicates that there is no race condition in the circuit. Similarly, where there are odd number of delays, a 1 for the output of the comparator, i.e. 116, indicates that, there is no race condition in the circuit. In another embodiment of the invention, where there are even number of delays, a 1 for the output of the comparator indicates a race condition in the circuit and for odd number of delays a 0 for the output of the comparator indicates a race condition in the circuit. One skilled in the art should understand that the comparator logic can be adjusted such that for even number of delays a 0 for the output of the comparator to indicate a race condition. Likewise, for odd number of delays a 1 for the output of the comparator indicates a race has occurred.

Thus, the circuit described in this embodiment helps to detect race conditions. If the outputs of comparators 114 and 116 are zero, then the design engineer can safely assume there is no race. By the same token, if the outputs of comparators 114 and 116 are one, this indicates a race condition in the circuit. Still referring to FIG. 1, the comparators 114 and 116 are further connected to set-reset elements (S-R-elements) 118 and 120 respectively. The set-reset elements 118 and 120 are initially reset with reset signal 122. The outputs of the comparators 114 and 116 are used to set the set-reset elements 118 and 120. If a race condition has occurred, the S-R elements 118 and 120 will be set to one by the outputs of the corresponding comparators connected to the S-R elements. Thus, race conditions may be detected by reading the outputs of the S-R elements 118 and 120. The number of delays required to prevent race conditions can be determined by the number of ones in the outputs of the S-R elements 118 and 120. The minimum number of delays required are one more than the number of ones in the outputs of the S-R elements 118 and 120. Even though FIG. 1 shows a delay 104, three memory elements 102, 106, and 110 and two S-R elements 118 and 120, one skilled in the art will appreciate that the number of memory elements and the number of delays can vary depending on the circuit design and the amount of data to be propagated through the memory elements.

Figure 2:
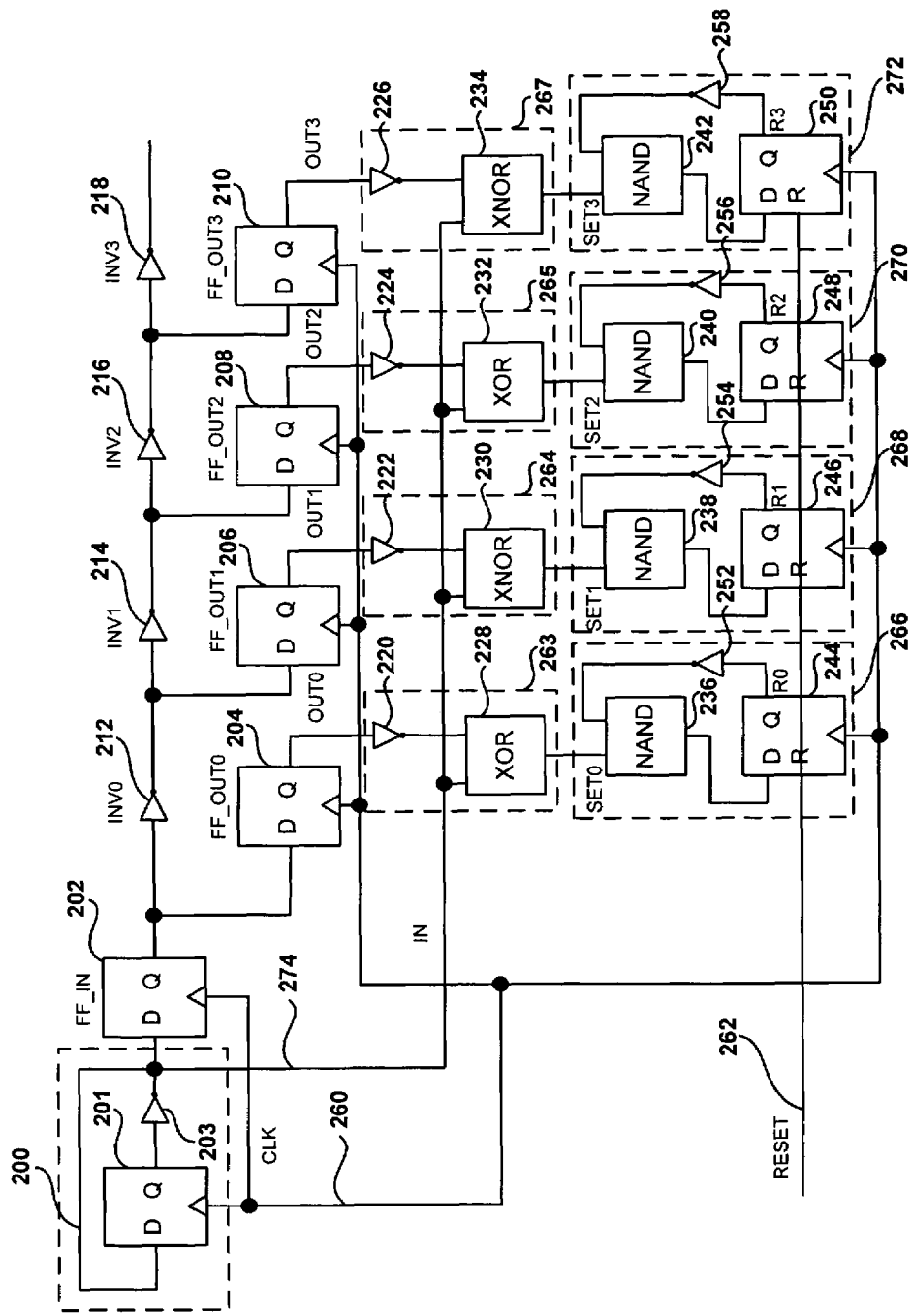
FIG. 2 shows another circuit for detecting race conditions and indicating the number of delays required for preventing race conditions in digital circuits in accordance with an embodiment of the present invention.

FIG. 2 shows another circuit for detecting race conditions and computing the number of delays required for preventing race conditions in digital circuits in accordance with an embodiment of the present invention. As shown, FIG. 2 includes a signal generator 200 that is capable of generating a data string of alternating 0's and 1's. The outputs of signal generator 200 feed the input of flip-flop 202. The signal generator 200, as shown, includes a flip-flop 201 and an inverter 203. It should be understood that other types of signal generators that are capable of generating a data string of alternating 0s and 1s may be used in place of the signal generator 200. The flip-flop 202 is further connected to an inverter 212 and flip-flop 204. The data that are generated by the signal generator 200 propagate through the flip-flops 202, 204, 206, 208, and 210. The states of the flip-flops 202, 204, 206, 208, and 210 change according to the clock cycle 260. The inverters 212, 214, 216, and 218 delay transmission of data from one flip-flop to the next in order to prevent race conditions. The inverters 212, 214, 216, and 218 act as delay elements between flip-flops to prevent the data from getting corrupted due to race condition.

As described above, there must be sufficient hold time in the memory elements to stabilize the data in order to prevent data corruption. The inverters 212, 214, 216, and 218 between the flip-flops provide the delay required to maintain the hold time in the flip-flops. As such, other devices besides inverters may be used to delay the data from reaching the flip-flop, for example, any device that might store the data temporarily, such as a buffer.

Still referring to FIG. 2, the outputs from flip-flops 204, 206, 208, and 210 are fed into the XOR gate 228, the XNOR gate 230, the XOR gate 232, and the XNOR gate 234 respectively via corresponding buffers 220, 222, 224, and 226 respectively. A second input to the XOR gates and XNOR gates described here in comes from the output 274 of the signal generator 200. Each of the XOR gates and XNOR gates described above combined with the corresponding buffers act as comparators 263, 264, 265, and 267. The comparators 263, 264, 265, and 267 compare outputs from the flip-flops 204, 206, 208, and 210 respectively with the data 260 generated by the signal generator 200. One skilled in the art will appreciate that other types of comparators besides the type shown in FIG. 2 might be used to compare the data. The outputs from the comparators are fed into one of the corresponding S-R-latches 266, 268, 270, and 272. The SR-latch 266 includes a NAND gate 236 that receives data from the output of comparator 264. The SR-latch further includes a flip-flop 244, which receives the output of the NAND gate 236. The output of the flip-flop 244 is fed back into the NAND gate 236 through inverters 252. The SR-latch 266 may be initially reset by a RESET signal 262. S-R-latches 268, 270 and 272 also have a structure similar to that of S-R-latch 266. One skilled in the art should understand that other types S-R-latches might be used in place of the S-R-latches illustrated in FIG. 2. For example, S-R-latches which use NOR gates instead of NAND gates can be used instead of the type of S-R-latches described in FIG. 2

Race conditions may be detected from the outputs of the S-R-latches. When a race condition occurs, S-R latches 266, 268, 270, and 272 may be set to 1 by the output of the corresponding comparators 263, 264, 265, and 267. As described above, the output of the XOR gate is zero when the inputs to the XOR gate are the same. Accordingly, in the present invention, when the output of the XOR gate is zero, implies there is no race condition in the circuit. Whereas, when the output of the XOR gate is 1, implies there is a race condition in the circuit. Similarly, the outputs of the XNOR gates are 1 when the inputs are the same. Therefore, in FIG. 2, a race condition is detected when the outputs of the XNOR gates are 1. Accordingly, there is no race condition in the circuit, if the outputs of XNOR gates are 0, when there are odd number of inverters between the first flip flop and the subsequent flip-flops. Conversely, there exists a race condition in the circuit, for odd number of inverters, if the outputs of the XNOR gates are 1. Thus, embodiments of the present invention provide a way of detecting race conditions in digital circuits.

As described above, the embodiments described herein not only detects race conditions, but also compute the number of delays to be incorporated into the circuit design to prevent race conditions. The number of delays required are one more than the number of "1s" in the S-R-latch output. The outputs of the S-R latches may be read through any available circuitry, for example, a scan circuitry (not shown).

Figure 3:
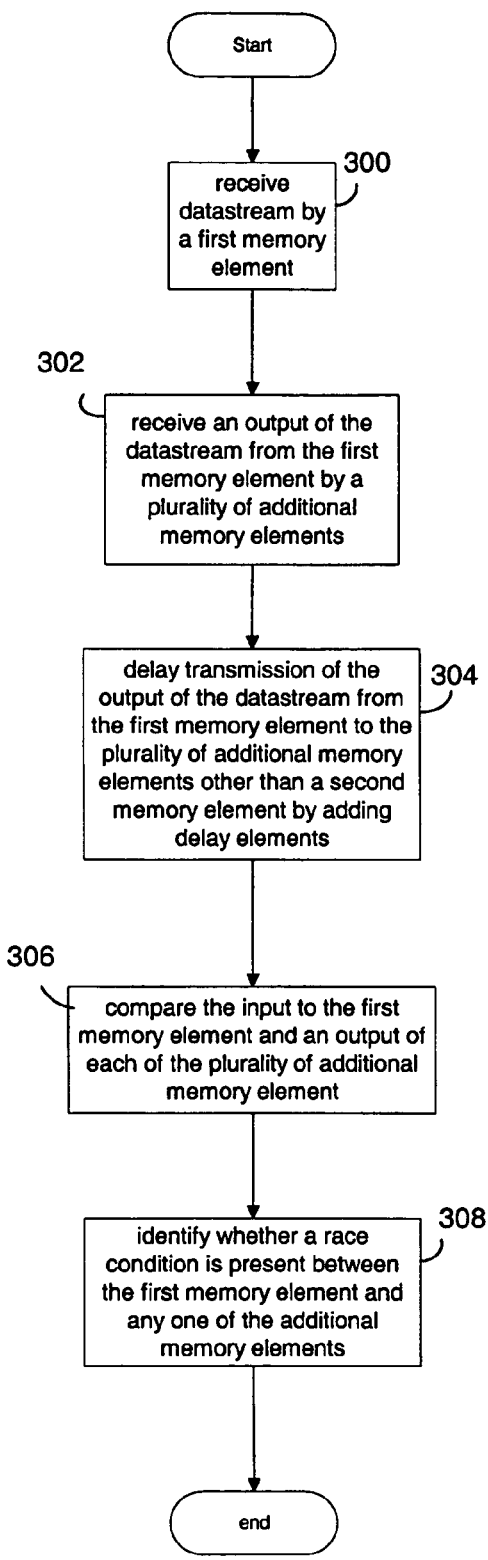
FIG. 3 is a flowchart illustrating the method of operations involved in detecting race conditions in a digital circuit and determining the number of delays required to prevent race conditions in accordance with an embodiment of the present invention.

FIG. 3 is a flowchart illustrating the method of operations involved in detecting race conditions in a digital circuit and determining the number of delays required to prevent race conditions in accordance with an embodiment of the present invention. The method is initiated by receiving data stream by a first memory element, as illustrated in operation 300. As described above, the data stream is generated by a data stream signal generator, which is capable of generating alternating 0s and 1s. The signal generator generates the data and the first memory element latches onto the data generated by the signal generator at a clock edge. The clock edge, as defined here, is the rising or falling edge of a clock signal. The first memory element outputs the data stream received by the first memory element at subsequent clock cycles. The output from the first memory element is received by additional memory elements at succeeding clock cycles as illustrated in operation 302.

Then in operation 304, the transmission of the data between the first memory element and the additional memory elements are delayed by adding delay elements between the first memory elements and the additional memory elements. Thereafter in operation 306, each output from the plurality of additional memory elements is compared with the input to the first memory element. As described above in detail, the comparison helps to identify whether a race condition occurred or not as shown in operation 308. If the comparison result is 1, then that indicates a race condition. Whereas, if the comparison result is 0, then that indicates a no race condition. Moreover, the comparison result also helps to figure out the number of delays that should be included in the design in order to prevent race condition in a digital circuit.

Another embodiment of the present invention includes a detection and prevention circuit. The circuit includes means for receiving data stream by a first memory element. The circuit further includes means for receiving outputs of the first memory elements by additional memory elements. The memory elements described herein changes states according to one universal clock cycle. The circuit also includes means for delaying the propagation of data stream to additional memory elements in order to prevent the data stream from reaching subsequent memory elements prior to one of the memory elements transfers existing data into the next memory element. The circuit further includes means to compare output of each of the additional memory elements with the input to the first memory element in order to detect race condition.

The race detection and protection circuit described herein may be incorporated into any suitable integrated circuit. For example, the circuit may be incorporated into any digital circuit especially the ones that include flip-flops or other memory elements. The digital circuit may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using digital circuit is desirable. The digital circuit can be used to perform a variety of different logic functions. For example, the digital circuit can be incorporated into a processor or a controller that works in cooperation with a system processor.

Although the foregoing invention has been described in some detail, for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

With the above embodiments in mind, it should be understood that the invention may be practiced with other computer system configurations including hand-held devices, microprocessor systems, microprocessor-based or programmable consumer electronics, minicomputers, mainframe computers and the like. Furthermore, the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A circuit for determining a degree of buffering required along a data bus to avoid race conditions, comprising:
   a plurality of memory elements sorted in sequence, wherein a first memory element of the plurality of memory elements receives a data stream, the input for each additional memory element other than the first memory element is the output from the first first memory element;
   delay elements defined to add delays to the inputs of the additional memory elements starting with a third memory element, wherein a memory element of order n receives the output from the first memory element after passing through (n−2) delay elements, wherein all of the delay elements introduce a same amount of time delay; and
   a plurality of comparators, wherein each comparator is associated with one of the additional memory elements, wherein each comparator compares the data stream and an output of the associated additional memory element, wherein each comparator identifies whether a race condition is present between the first memory element and the corresponding additional memory element.

2. A circuit for determining a degree of buffering required along a data bus to avoid race conditions as recited in claim 1, wherein a number of comparators signaling a race condition identifies a number of delays needed along a data bus to avoid the race conditions.

3. A circuit for determining a degree of buffering required along a data bus to avoid race conditions as recited in claim 2, wherein the identified number of delays is the number of comparators signaling the race condition plus one.

4. A circuit for determining a degree of buffering required along a data bus to avoid race conditions as recited in claim 1, wherein the data stream includes a string of alternating logical 0s and 1s.

5. A circuit for determining a degree of buffering required along a data bus to avoid race conditions as recited in claim 1, wherein identifying by the comparator whether a race condition is present further includes,
   performing a logical operation between the data stream and the output of the corresponding additional memory element, wherein the logical operation is a XOR function when the additional memory element is of an even order number in the plurality of memory elements and an XNOR function otherwise.

6. A circuit for determining a degree of buffering required along a data bus to avoid race conditions as recited in claim 5, wherein the output of the logical operation being one indicates a race condition and being zero indicates no race condition.

7. A circuit for determining a degree of buffering required along a data bus to avoid race conditions as recited in claim 1, wherein the delay elements are inverters.

8. A method for detecting race conditions comprising:
   receiving a data stream by a first memory element, wherein the first memory element is part of a plurality of memory elements sorted in sequence;
   receiving the output from the first memory element by each additional memory element other than the first memory element;
   delaying data stream propagation between the first memory element and the plurality of additional memory elements starting with a third memory element using delay elements, wherein a memory element of order n receives the output from the first memory element after passing through (n−2) delay elements, wherein all of the delay elements introduce a same amount of time delay;
   comparing the data stream and an output of each of the plurality of additional memory elements; and
   identifying whether a race condition is present between the first memory element and any one of the plurality of additional memory elements based on the comparison.

9. A method for detecting race conditions as recited in claim 8, further comprising:
   generating data streams of alternating 0s and 1s to be received by the first memory element.

10. A method for detecting race conditions as recited in claim 8, wherein comparing includes,
    performing an XOR function of the input to the first memory element and an output of each of an even numbered plurality of additional memory elements; and
    performing an XNOR function of the input to the first memory element and an output of each of an odd numbered plurality of additional memory elements.

11. A method for detecting race conditions as recited in claim 10, wherein identifying race condition includes,
    determining whether an output of the XOR function is 0 or 1 wherein, 0 indicating no race condition; and
    determining whether an output of the XNOR function is 0 or 1 wherein 0 indicating no race condition.

12. A method for detecting race conditions as recited in claim 11, further comprising:
    setting a set-reset latch to 1 when an output of the XOR function or the XNOR function is 1, indicating a race condition.

13. A method for detecting race conditions as recited in claim 12, further comprising:
    evaluating number of delays to be included to prevent race condition, wherein the evaluating includes,
    reading the output of the set-reset latch;
    determining the number of 1s in the output of the set-reset latch, wherein the number of 1s signaling a race condition; and
    identifying the number of delays required by adding 1 to the number of 1s in the output of the set-reset latch.

14. A method for detecting race conditions as recited in claim 8, further comprising:
    resetting a set-reset latch.

15. A circuit for determining a degree of buffering required along a data
    bus to avoid race conditions, comprising:

circuit means for receiving a data stream by a first memory element, wherein the first memory element is part of a plurality of memory elements sorted in sequence;

circuit means for receiving the output from the first memory element by each additional memory element other than the first memory element;

circuit means for delaying data stream propagation between the first memory element and the plurality of additional memory elements starting with a third memory element using delay elements, wherein a memory element of order n receives the output from the first memory element after passing through (n−2) delay elements, wherein all of the delay elements introduce a same amount of time delay;

circuit means for comparing the data stream and an output of each of the plurality of additional memory elements; and circuit means for identifying whether a race condition is present between the first memory element and any one of the plurality of additional memory elements based on the comparison.

* * * * *